United States Patent
Yamanouchi et al.

(10) Patent No.: US 8,198,950 B2
(45) Date of Patent: Jun. 12, 2012

(54) POWER AMPLIFIER

(75) Inventors: Shingo Yamanouchi, Tokyo (JP);
Kazuaki Kunihiro, Tokyo (JP); Kazumi Shiikuma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/063,127

(22) PCT Filed: Oct. 1, 2009

(86) PCT No.: PCT/JP2009/067139
§ 371 (c)(1),
(2), (4) Date: Mar. 9, 2011

(87) PCT Pub. No.: WO2010/044346
PCT Pub. Date: Apr. 22, 2010

(65) Prior Publication Data
US 2011/0163822 A1    Jul. 7, 2011

(30) Foreign Application Priority Data
Oct. 16, 2008 (JP) .................. 2008-267687

(51) Int. Cl.
*H03C 3/00* (2006.01)
*H03C 3/38* (2006.01)
(52) U.S. Cl. ...................... 332/145; 332/144
(58) Field of Classification Search .......... 332/144, 332/145, 149, 151
See application file for complete search history.

(56) References Cited

U.S. PATENT DOCUMENTS
6,191,653 B1 * 2/2001 Camp et al. .......... 330/129

FOREIGN PATENT DOCUMENTS

| JP | 8-154020 A | 6/1996 |
|---|---|---|
| JP | 2003179444 A | 6/2003 |
| JP | 2003526980 A | 9/2003 |
| JP | 2005045782 A | 2/2005 |
| JP | 2005102146 A | 4/2005 |
| JP | 2005277559 A | 10/2005 |
| JP | 2005318394 A | 11/2005 |
| JP | 2005341550 A | 12/2005 |
| JP | 2006121408 A | 5/2006 |
| JP | 2006270562 A | 10/2006 |
| JP | 2007514311 A | 5/2007 |
| JP | 2007318359 A | 12/2007 |
| WO | 2008078565 A | 7/2008 |
| WO | 2008099466 A | 8/2008 |

OTHER PUBLICATIONS

International Search Report for PCT/JP2009/067139 mailed Dec. 22, 2009.
D. Rudolph, "Out-of-Band Emissions of Digital Transmissions Using Kahn EER Technique", IEEE Transactions on Microwave Theory and Techniques, vol. 50, No. 8, 2002, pp. 1979-1983.

* cited by examiner

Primary Examiner — David Mis

(57) ABSTRACT

A power amplifier that amplifies an RF modulation signal containing an amplitude modulation component and a phase modulation component, including a polar modulator that outputs an amplitude component signal that is the amplitude modulation component of the RF modulation signal, a direct current power supply that outputs a direct current voltage, a pulse modulator that pulse-modulates the amplitude component signal, a pulse amplification circuit that amplifies a pulse modulation signal, a combining circuit that adds a direct current voltage that is outputted from the direct current power supply to an output signal of the pulse amplification circuit, a low pass filter that smoothens an output signal of the combining circuit, and an RF amplifier that not only amplifies the RF modulation signal, but also amplitude-modulates the amplified signal with an output signal of the low pass filter and outputs the resultant signal.

21 Claims, 9 Drawing Sheets

(a)

(b)

(c)

POWER AMPLIFIER

The present application is the National Phase of PCT/JP2009/067139, filed Oct. 1, 2009, which claims a priority based on Japanese Patent Application No. 2008-267687 filed on Oct. 16, 2008, the entire contents of which being incorporated herein by reference in its entirety.

TECHNICAL FIELD

The present invention relates to a power amplifier mainly used for a radio communication device.

BACKGROUND ART

From among the components in a radio communication device, the power amplifier consumes the most electric power. Thus, the improvement of power efficiency of the power amplifier will become an important task to solve. In recent years, a radio communication standard that uses an amplitude modulation system so as to improve spectrum efficiency has been becoming mainstream. Since this amplitude modulation system strictly restricts signal distortion, the power amplifier needs to be operated in a high back-off state (low input power) in which good linearity can be obtained. However, if the power amplifier is operated in the high back-off state, the power efficiency thereof will be reduced.

Thus, in recent years, polar modulation techniques such as those that maintain the linearity between input and output signals, while improving the power efficiency of power amplifiers, have been aggressively studied.

FIG. 1 shows an exemplary structure of a power amplifier based on the ET (Envelope Tracking) system as one sort of polar modulation technique.

The ET system is a technique that improves power efficiency while maintaining the linearity between input and output signals in such a manner that an RF (Radio Frequency) modulation signal containing an amplitude modulation (AM: Amplitude Modulation) component and a phase modulation (PM: Phase modulation) component is amplified, the AM component is extracted from the RF modulation signal, and the amplified RF modulation signal is amplitude-modulated with the AM component.

As shown in FIG. 1, a power amplifier based on the ET technique according to the related art is provided with polar modulator 311, RF-PA (Power Amplifier) 306, and power supply modulator 304.

Polar modulator 311 extracts an AM component from an RF modulation signal that is inputted from terminal 301 or an RF modulation signal in which a base band signal that is inputted from terminal 301 is superimposed on a carrier and the extracted AM component is outputted to power supply modulator 304 through terminal 302. In addition, polar modulator 311 outputs the RF modulation signal that is inputted from terminal 301 or RF modulation signal 308 in which the base band signal that is inputted from terminal 301 is superimposed on the carrier to RF-PA 306 through terminal 307.

FIG. 2 is a block diagram showing an exemplary structure of a polar modulator used for a power amplifier based on the ET system. FIG. 3 is a block diagram showing another exemplary structure of the polar modulator used for the power amplifier based on the ET system. Polar modulator 311 shown in FIG. 2 is a preferred example used for a structure in which the RF modulation signal is inputted from terminal 301, whereas polar modulator 311 shown in FIG. 3 is a preferred example used for a structure in which the base band signal is inputted from terminal 301.

Polar modulator 311 shown in FIG. 2 is structured with amplitude detector 130 that extracts an AM component from an RF modulation signal that is inputted from terminal 301 and outputs the extracted AM component as amplitude component signal 303 from 302 and delay compensator 131 that adjusts a delay amount of the RF modulation signal that is inputted from terminal 301 and outputs the adjusted signal from terminal 307.

The RF modulation signal that is inputted from terminal 301 is supplied not only to amplitude detector 130, but also to delay compensator 131. In polar modulator 311 shown in FIG. 2, delay compensator 131 can adjust the difference of delay times of amplitude component signal 303 that is outputted from amplitude detector 130 and RF modulation signal 308 that is outputted from terminal 307.

On the other hand, polar modulator 311 shown in FIG. 3 is structured with base band signal processing circuit 150 and quadrature modulator 152. Base band signal processing circuit 150 is structured for example with a DSP (Digital signal Processor) and a D/A (Digital to Analog) converter.

Base band signal processing circuit 150 causes the DSP to compute and extract an AM component from a base band signal that is inputted from terminal 301 through a digital process, causes the D/A converter to convert the AM component into an analog signal, and outputs the converted signal as amplitude component signal 303 from terminal 302. In addition, base band signal processing circuit 150 causes the D/A converter to convert the base band signal that is inputted from terminal 301 into an analog signal and then outputs the converted signal to quadrature modulator 152.

Quadrature modulator 152 up-converts the base band signal that is outputted from base band signal processing circuit 150 to an RF frequency and outputs the resultant signal as RF modulation signal 308 from terminal 307. Base band signal processing circuit 150 is provided with a function that can set respective output timings of amplitude component signal 303 and RF modulation signal 308.

Power supply modulator 304 amplifies amplitude component signal 303 that is outputted from polar modulator 311 and that supplies the amplified signal to power supply terminal 309 of RF-PA (Radio Frequency Power Amplifier) 306.

RF-PA 306 amplifies RF modulation signal 308 that is outputted from polar modulator 311. At this point, since amplitude component signal 305 amplified by power supply modulator 304 has been supplied to power supply terminal 309 of RF-PA 306, when the output power of RF-PA 306 is low, the voltage supplied to power supply terminal 309 also becomes low. Thus, the power supplied as a power supply to RF-PA 306 is suppressed to the minimally required power and thereby wasteful power consumption is reduced.

Besides the above-described ET system, as another sort of polar modulation techniques, the EER (Envelop Elimination and Restoration) system is also known.

The EER system is a technique that restores an original waveform of an input signal while linearly amplifying it in such a manner that an AM component is removed from an RF modulation signal containing an AM component and a PM component, so that only the remaining PM component is amplified, and the amplified PM component is amplitude-modulated with the AM component. The structure of a power amplifier based on the EER system according to the related art is shown in FIG. 4.

As shown in FIG. 4, the power amplifier based on the EER system has the same structure as the power amplifier based on the ET system shown in FIG. 1 except for the structure and operation of polar modulator 311. Thus, here, an explanation for structural components other than polar modulator 311 will be omitted. Structural components shown in FIG. 4 are denoted by similar reference numbers to those of the power amplifier shown in FIG. 1.

FIG. 5 is a block diagram showing an exemplary structure of a polar modulator used for a power amplifier based on the EER system, whereas FIG. 6 is a block diagram showing another exemplary structure of the polar modulator used for the power amplifier based on the EER system. Polar modulator 311 shown in FIG. 5 is a preferred example used for a structure in which an RF modulation signal is inputted from terminal 301, whereas polar modulator 311 shown in FIG. 6 is a preferred example used for a structure of which a base band signal is inputted from terminal 301.

Polar modulator 311 shown in FIG. 5 is structured with amplitude detector 130 that extracts an AM component from an RF modulation signal that is inputted from terminal 301 and outputs the extracted AM component as amplitude component signal 303 from terminal 302; delay compensator 131 that adjusts the delay amount of the RF modulation signal that is inputted from terminal 301 and outputs the adjusted RF modulation signal; and limiter 132 that removes the AM component from the signal that is supplied from delay compensator 131. Limiter 132 removes the AM component from the RF modulation signal that is outputted from delay compensator 131 and outputs phase component signal 313 as the remaining PM component from terminal 307. In polar modulator 311 shown in FIG. 5, delay compensator 131 can adjust the difference of delay times of amplitude component signal 303 that is outputted from amplitude detector 130 and phase component signal 313 that is outputted from terminal 307.

In contrast, polar modulator 311 shown in FIG. 6 is structured to include base band signal processing circuit 150 and VCO (Voltage Controlling Oscillator) 151. Base band signal processing circuit 150 is structured to include, for example, a DSP and a D/A converter.

Base band signal processing circuit 150 causes the DSP to compute and extract an AM component from a base band signal that is inputted from terminal 301 through a digital process, causes the built-in D/A converter to convert the AM component into an analog signal, and outputs the converted signal as amplitude component signal 303 from terminal 302. In addition, base band signal processing circuit 150 causes the DSP to compute and extract the PM component from the base band signal that is inputted from terminal 301 through a digital process, generate a control signal that causes VCO 151 to output phase component signal 313, causes the built-in D/A converter to convert the generated signal into an analog signal, and outputs the converted signal to VCO 151.

VCO 151 outputs phase component signal 313 that is up-converted into an RF frequency according to the control signal that is outputted from base band signal processing circuit 150. In addition, base band signal processing circuit 150 has a function that can set respective output timings of amplitude component signal 303 and phase component signal 313.

Like the power amplifier based on the ET system shown in FIG. 1, the power amplifier based on the EER system shown in FIG. 4 causes power supply modulator 304 to amplify amplitude component signal 303 that is outputted from polar modulator 311 and supplies the amplified signal to power supply terminal 309 of RF-PA 306.

RF-PA 306 amplifies phase component signal 313 that is outputted from polar modulator 311. At this point, since amplitude component signal 305 amplified by power supply modulator 304 has been supplied to power supply terminal 309 of RF-PA 306, when the output power of RF-PA 306 is low, the voltage supplied to power supply terminal 309 also becomes low. Thus, the power supplied as a power supply to RF-PA 306 is suppressed to the minimally required power and thereby wasteful power consumption is reduced.

In the above-described power amplifier based on ET type and EER systems, power supply modulator 304 needs to satisfy all wide band (high speed) characteristics, and wide dynamic range (high voltage operation, low noise) characteristics, and high power efficiency. However, it is difficult for power supply modulator 304 according to the related art to satisfy all these requirements.

For example, if a linear regulator is used for power supply modulator 304, although wide band (high speed) characteristics and wide dynamic range (low noise) characteristics can be accomplished, it is difficult to accomplish high power efficiency. In contrast, if a switching regular is used for power supply modulator 304, although high power efficiency can be accomplished, it is difficult to accomplish wide band (high speed) characteristics and wide dynamic range (low noise) characteristics.

In addition, since a transistor used for signal amplification has a tendency in which the operation speed is in inverse proportion to the maximum operation voltage, it is further difficult for power supply modulator 304 that is structured to include only transistors to satisfy both high voltage operation and wide band (high speed) characteristics.

Further, with respect to polar modulation techniques, Non-Patent Literature 1 has pointed out that when amplitude component signal 305 supplied to power supply terminal 309 of RF-PA 306 is low, distortion occurs in RF modulation output signal 310 that is outputted from RF-PA 306.

As countermeasures, Non-Patent Literature 1 has proposed that a lower limit value be set for amplitude component signal 305 supplied to power supply terminal 309 of RF-PA 306.

A method that can solve the problem of such polar modulation techniques is described for example in Patent Literature 1. Next, a power amplifier described in Patent Literature 1 will be explained with reference to FIG. 7(a) to (c).

FIG. 7 shows a structure and an operation of the power amplifier described in Patent Literature 1: (a) of the drawing being a block diagram showing a circuit structure; (b) of the drawing being an exemplary waveform diagram showing an input signal; (c) of the drawing being a waveform diagram showing an exemplary output signal of a power supply modulator.

In the power amplifier shown in FIG. 7(a), if the amplitude component of the input signal is lower than a threshold L denoted by a dotted line of FIG. 7(b), a direct current voltage that is a constant voltage is supplied as a power supply from VE-LOAD 205 to RF-PA 204.

If the amplitude component of the input signal is higher than threshold L, as shown in FIG. 7(c), a signal in which only the amplitude component of the input signal that exceeds the threshold L is amplified, the amplified signal will be added to the direct current voltage that is outputted from VE-LOAD 205, and the added voltage will be supplied as a power supply to RF-PA 204 from analog power valve (APV) 203.

In the power amplifier shown in FIG. 7(a), since a direct current component that occupies most of the amplitude signal supplied as a power supply to RF-PA 204 is supplied from VE-LOAD 205 structured to have a DC-DC converter having a high power efficiency, the power efficiency of the entire power amplifier can be improved. In addition, by setting a lower limit for the voltage supplied from APV 203 that amplifies the amplitude component of the input signal to RF-PA 204, APV 203 can be structured to have a circuit having a narrow dynamic range and when the power supply voltage is low, distortion that occurs in the output signal of RF-PA 204 can be reduced.

Moreover, another method that solves the problem of the above-described polar modulation techniques is described for example in Patent Literature 2. Next, a power amplifier described in Patent Literature 2 will be explained with reference to FIG. 8.

FIG. 8 is a block diagram showing a structure of the power amplifier described in Patent Literature 2.

The power amplifier shown in FIG. 8 is structured in such a manner that a low frequency component of an input signal is amplified using low pass filter (LPF) 1 and DC/DC converter 2, a high frequency component of the input signal is amplified using class B amplifier 3 and high pass filter (HPF) 4, the amplified low frequency component and high frequency component are combined, and the combined components are supplied as a power supply voltage to an RF-PA (not shown).

Since the power amplifier shown in FIG. 8 uses DC/DC converter 2 that can amplify only a low frequency component with high power efficiency and class B amplifier 3 that can amplify a high frequency component with low power efficiency, the power amplifier can amplify a signal with relatively high power efficiency and wide band (high speed).

Furthermore, another method that solves the problem of the above-described polar modulation techniques is described for example in Patent Literature 3. A power amplifier described in Patent Literature 3 will be explained with reference to FIG. 9.

FIG. 9 is a block diagram showing a structure of the power amplifier described in Patent Literature 3.

The power amplifier shown in FIG. 9 is structured with a plurality of DC-DC converters 104 through 108 and switches 110 through 114 that switch output voltages of DC-DC converters 110 through 114 and output a selected output voltage such that an optimum voltage is supplied to a collector of a transistor with which a linear regulator is provided through switches 110 through 114.

The power amplifier shown in FIG. 9 switches a direct current component of a power supply voltage that is supplied to RF-PA 124 corresponding to an amplitude value of an amplitude component signal so as to realize all wide band characteristics, wide dynamic range characteristics, and low power efficiency that cannot be realized by a circuit that uses a single power supply.

In the power amplifier shown in FIG. 7(*a*) (described in Patent Literature 1) from among the above-described related art, the waveform of the power supply voltage supplied to the RF-PA takes on a hard clipping shape as shown in FIG. 7(*c*). For example, Japanese Patent Laid-Open No. 2005-45782A has pointed out that if a voltage having such a differentially discontinuous waveform is supplied as a power supply to the RF-PA, distortion occurs in an output signal of the RF-PA. The differentially discontinuation denotes that a curve that represents a change of a power supply voltage cannot be mathematically differentiated (namely, a change ratio is discontinuous).

On the other hand, since the power amplifier shown in FIG. 8 (described in Patent Literature 2) uses a class B amplifier with relatively low power efficiency, the improvement of power efficiency of the entire power amplifier is limited. In addition, since the power amplifier described in Patent Literature 2 is provided with a circuit that separates an input signal into a low frequency component and a high frequency component and a circuit that combines the low frequency component and the high frequency component that have been amplified and thereby the circuit scale becomes large, it is difficult to miniaturize the power amplifier and reduce the cost thereof. Moreover, since the power amplifier described in Patent Literature 2 combines the low frequency component and the high frequency component that have been amplified and supplies the combined components as a power supply voltage to the RF-PA, distortion occurs in the output signal of the RF-PA due to the combination.

On the other hand, since the power amplifier shown in FIG. 9 (described in Patent Literature 3) needs to provide a power supply device that generates a plurality of direct current voltages, a plurality of switches that switch these output voltages, and a control circuit that controls the operations of the switches and thereby the circuit of the power amplifier becomes complicated and the circuit scale becomes large, it is difficult to miniaturize the power amplifier and reduce the cost thereof.

In other words, since the power amplifiers described in Patent Literature 1 and Patent Literature 2 have a problem in which a distortion occurs in an output signal caused by a circuit added to improve power efficiency and a problem in which a power consumption increase is caused by a circuit that is added to prevent the distortion from occurring in the output signal, both the improvement of power efficiency and the suppression of distortion that occurs in the output signal cannot be satisfied.

On the other hand, since the power amplifier described in Patent Literature 3 needs to additionally provide a large scale circuit that satisfies both the improvement of power efficiency and the suppression of distortion that occurs in the output signal, it is difficult to miniaturize the power amplifier and reduce the cost thereof.

RELATED ART LITERATURES

Patent Literatures
Patent Literature 1: Japanese Patent Laid-Open No. 2003-526980A (translation version of PCT application)
Patent Literature 2: Japanese Patent Laid-Open No. 2005-102146A
Patent Literature 3: Japanese Patent Laid-Open No. 2005-277559A
Non-Patent Literatures
Non-Patent Literature 1: IEEE Transactions on Microwave Theory and Techniques, Vol. 50, no. 8, pp. 1979-1983, 2002)

SUMMARY

An exemplary object of the invention is to provide a power amplifier that can meet the following requirements: reduce an increase in circuit size, improve power efficiency, and reduce distortion that occurs in an output signal.

In order to achieve the object, a power amplifier according to an exemplary aspect of the present invention that amplifies an RF modulation signal containing an amplitude modulation component and a phase modulation component, comprises:

a polar modulator that outputs an amplitude component signal that is the amplitude modulation component of said RF modulation signal;

a first direct current power supply that outputs a direct current voltage;

a pulse modulator that pulse-modulates said amplitude component signal;

a pulse amplification circuit that amplifies a pulse modulation signal that is outputted from said pulse modulator;

a combining circuit that adds a direct current voltage that is outputted from said first direct current power supply to an output signal of said pulse amplification circuit;

a low pass filter that smoothens an output signal of said combining circuit; and an RF amplifier that not only amplifies said RF modulation signal, but also amplitude-modulates the amplified signal with an output signal of said low pass filter and outputs the resultant signal.

Alternatively, a power amplifier according to an exemplary aspect of the present invention that amplifies an RF modulation signal containing an amplitude modulation component and a phase modulation component, comprises:

a polar modulator that outputs an amplitude component signal that is the amplitude modulation component of said RF modulation signal and a phase component signal that is the phase modulation component of said RF modulation signal;

a first direct current power supply that outputs a direct current voltage;

a pulse modulation circuit that pulse-modulates said amplitude component signal;

a pulse amplification circuit that amplifies a pulse modulation signal that is outputted from said pulse modulation circuit;

a combining circuit that adds a direct current voltage that is outputted from said first direct current power supply to an output signal of said pulse amplification circuit;

a low pass filter that smoothens an output signal of said combining circuit; and an RF amplifier that not only amplifies said phase modulation signal, but also amplitude-modulates the amplified signal with an output signal of said low pass filter and outputs the resultant signal.

Alternatively, a power amplifier according to an exemplary aspect of the present invention that amplifies an RF modulation signal containing an amplitude modulation component and a phase modulation component, comprises:

a polar modulator that outputs an amplitude component signal that is the amplitude modulation component of said RF modulation signal;

a control power supply that amplifies said amplitude component signal or a low frequency component of the amplitude component signal;

a pulse modulator that pulse-modulates said amplitude component signal;

a pulse amplification circuit that amplifies a pulse modulation signal that is outputted from said pulse modulator;

a combining circuit that adds an output voltage of said control power supply to an output signal of said pulse amplification circuit;

a low pass filter that smoothens an output signal of said combining circuit; and an RF amplifier that not only amplifies said RF modulation signal, but also amplitude-modulates the amplified signal with an output signal of said low pass filter and outputs the resultant signal.

Alternatively, a power amplifier according to an exemplary aspect of the present invention that amplifies an RF modulation signal containing an amplitude modulation component and a phase modulation component, comprises:

a polar modulator that outputs an amplitude component signal that is the amplitude modulation component of said RF modulation signal and a phase component signal that is the phase modulation component of said RF modulation signal;

a control power supply that amplifies said amplitude component signal or a low frequency component of the amplitude component signal;

a pulse modulation circuit that pulse-modulates said amplitude component signal;

a pulse amplification circuit that amplifies a pulse modulation signal that is outputted from said pulse modulation circuit;

a combining circuit that adds an output voltage of said control power supply to an output signal of said pulse amplification circuit;

a low pass filter that smoothens an output signal of said combining circuit; and an RF amplifier that not only amplifies said phase component signal, but also amplitude-modulates the amplified signal with an output signal of said low pass filter and outputs the resultant signal.

EXEMPLARY EMBODIMENT

Figure 1:
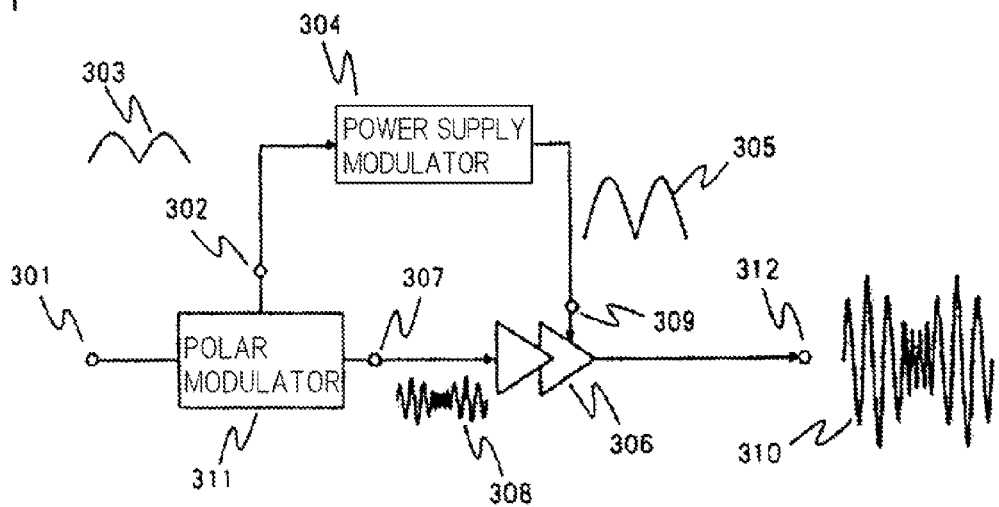
FIG. 1 is a block diagram showing a structure of a power amplifier based on the ET system according to the related art.
Figure 2:
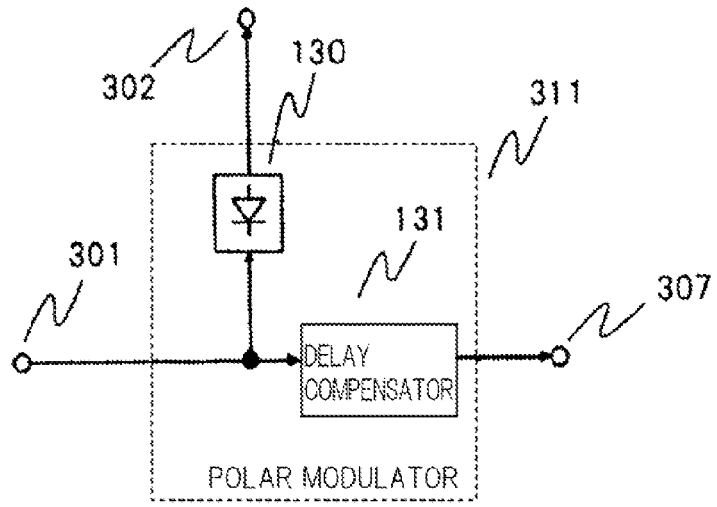
FIG. 2 is a block diagram showing an exemplary structure of a polar modulator used for a power amplifier based on the ET system.
Figure 3:
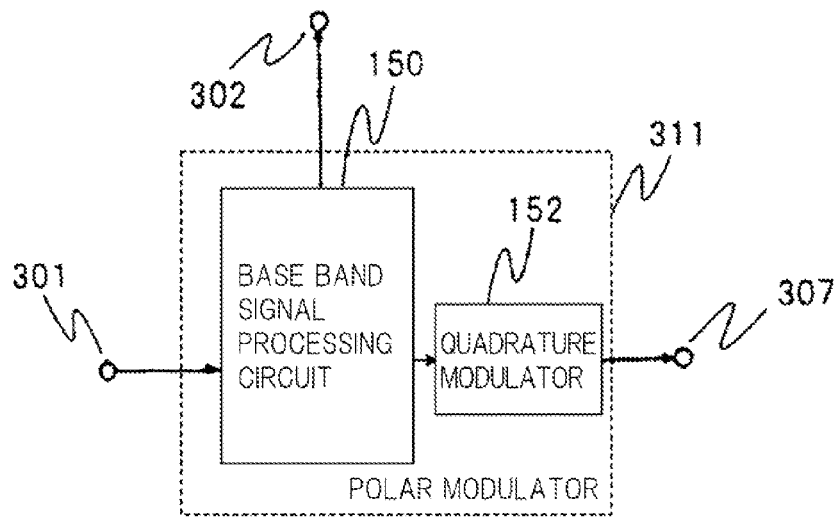
FIG. 3 is a block diagram showing another exemplary structure of the polar modulator used for a power amplifier based on the ET system.
Figure 4:
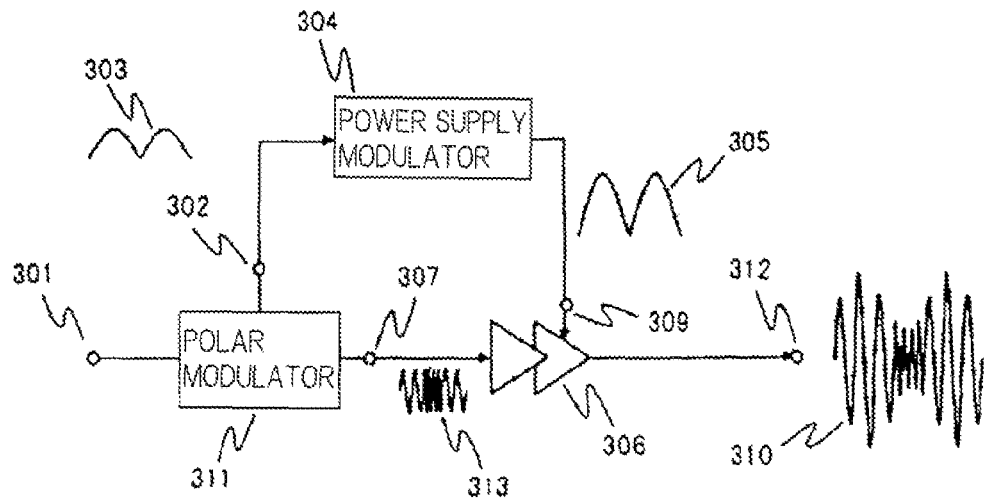
FIG. 4 is a block diagram showing a structure of a power amplifier based on the EER system according to the related art.
Figure 5:
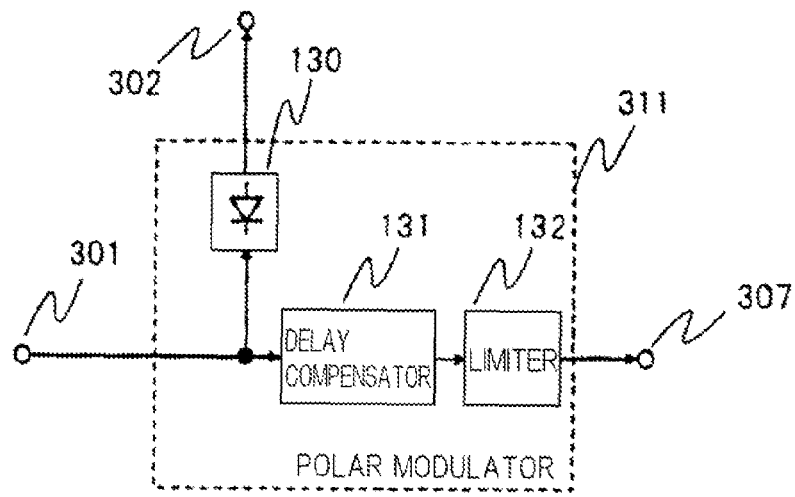
FIG. 5 is a block diagram showing an exemplary structure of a polar modulator used for a power amplifier based on the EER system.
Figure 6:
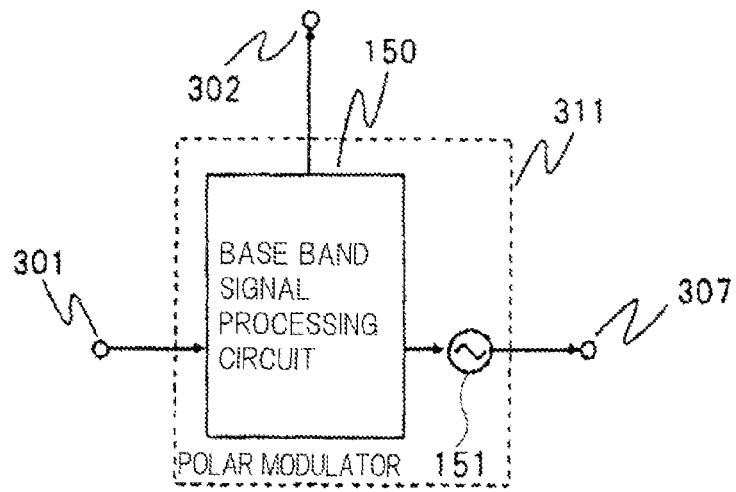
FIG. 6 is a block diagram showing another exemplary structure of the polar modulator used for a power amplifier based on the EER system.

Next, with reference to drawings, the present invention will be explained.

It should be noted that in the following, identical reference numerals will be assigned to identical or corresponding portions in each drawing and that they will not be redundantly explained.

(First Exemplary Embodiment)

Figure 10:
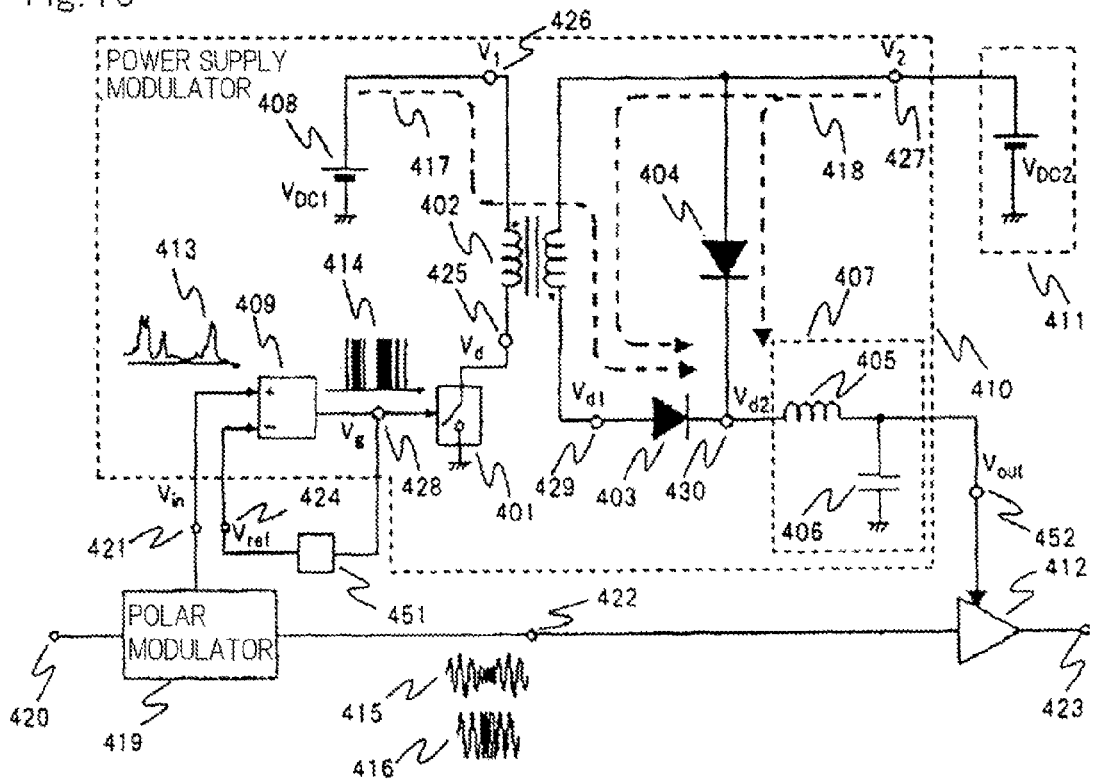
FIG. 10 is a block diagram showing a structure of a power amplifier according to a first exemplary embodiment.
Figure 11:
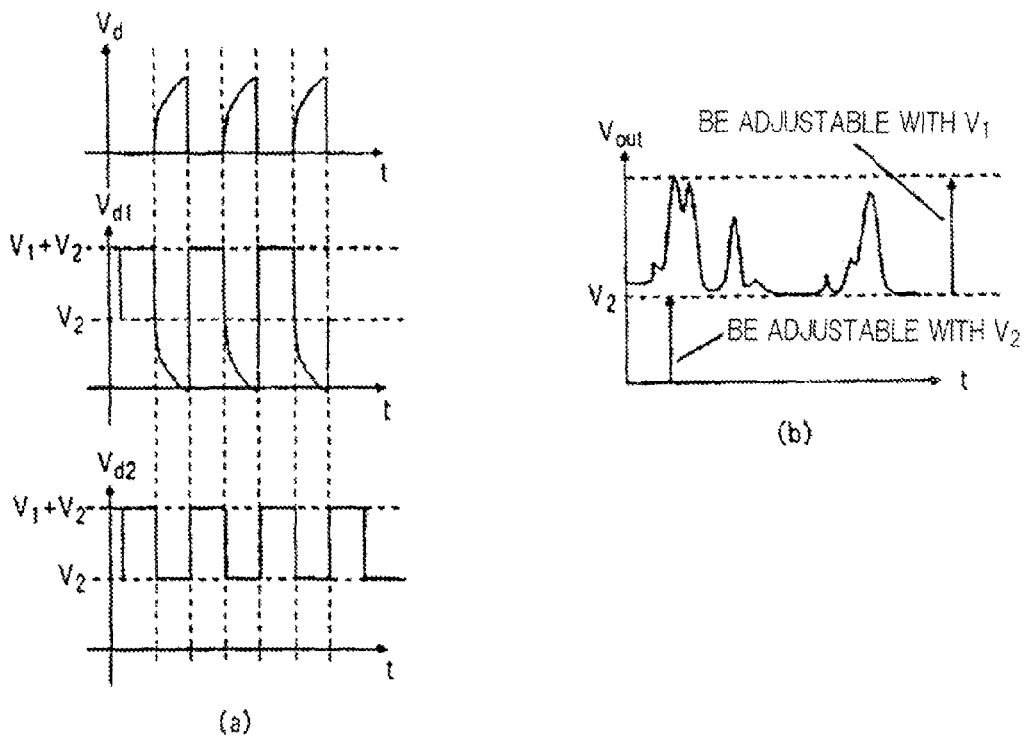
FIG. 11 shows an operation of the power amplifier shown in FIG. 10, (a) of a drawing which is a waveform diagram that shows an exemplary waveform of a signal that is inputted to an LPF, (b) of a drawing which is a waveform diagram that shows an exemplary waveform of a signal that is outputted from a power supply modulator.

FIG. 10 is a block diagram showing a structure of a power amplifier according to a first exemplary embodiment. FIG. 11 shows an operation of the power amplifier shown in FIG. 10, (a) of a drawing which is a waveform diagram that shows an exemplary waveform of a signal that is inputted to an LPF, and (b) of a drawing which is a waveform diagram that shows an exemplary waveform of a signal that is outputted from a power supply modulator.

As shown in FIG. 10, the power amplifier according to the first exemplary embodiment is provided with polar modulator 419, RF-PA 412, power supply modulator 410, and direct current power supply 411.

For polar modulator 419, polar modulator 311 according to the related art shown in FIG. 2, FIG. 3, FIG. 5, or FIG. 6 can be used.

Polar modulator 419 extracts an AM component from an RF modulation signal that is inputted from terminal 420 or au RF modulation signal in which a base band signal that is inputted from terminal 420 is superimposed on a carrier and outputs the extracted AM component as amplitude component signal 413 to power supply modulator 410 through terminal 421. In addition, polar modulator 419 outputs the RF modulation signal that is inputted from terminal 412, or the RF modulation signal in which the base band signal that is inputted from terminal 412 is superimposed on the carrier, or phase component signal 416 that is a PM component of the RF modulation signal to RF-PA 412 through terminal 422. In addition, polar modulator 419 also has a function that sets respective output timings of amplitude component signal 413 and RF modulation signal 415 or phase modulation signal 416.

RF-PA 412 uses a voltage supplied from power supply modulator 410 as a power supply and amplifies RF modulation signal 415 or phase modulation signal 416 that is outputted from polar modulator 419.

As shown in FIG. 10, power supply modulator 410 according to the first exemplary embodiment is provided with switch element 401, transformer 402, diode switches 403 and 404, LPF (low pass filter) 407, direct current power supply 408, and pulse modulator 409.

Pulse modulator 409 pulse-modulates amplitude component signal 413 that is inputted to terminal 421 (Vin) and outputs the resultant signal as pulse modulation signal 414 to switch element 401 through terminal 428 (Vg). It is preferred that this pulse modulation signal 414 have an amplitude sufficient to drive switch element 401. Pulse modulator 409 according to this exemplary embodiment is structured in such a manner that an output signal of terminal 428 (Vg) through pulse modulator 409 is negatively fed back to input terminal 424 (Vref) through integrator 451. Thus, pulse modulation signal 414 corresponding to amplitude component signal 413 can be accurately generated by pulse modulator 409. For pulse modulator 409, a known pulse modulation circuit based on the PWM (Pulse Width Modulation) system, Δ modulation system, ΔΣ modulation system, or the like can be used.

A direct current voltage that is outputted from direct current power supply 408 is supplied to one end of a primary winding of transformer 402, whereas switch element 401 is connected to another end of the primary winding of transformer 402.

Switch element 401 is turned on or off corresponding to pulse modulation signal 414 that is outputted from pulse modulator 409 so as to supply power corresponding to pulse modulation signal 414 to the primary winding of transformer 402. Thus, a signal $V_{d1}$ in which pulse modulation signal 409 is amplified is outputted from a secondary winding of transformer 402. Transformer 402, direct current power supply 408, and switch element 401 function as a pulse amplification circuit that amplifies the pulse modulation signal that is outputted from pulse modulator 409. For switch element 401, a transistor such as a MOSFET can be used.

Diode switches 403 and 404 add a direct current voltage $V_2$ that is outputted from direct current power supply 411 to the signal $V_{d1}$ that is outputted from the secondary winding of transformer 402 and outputs the resultant signal to LPF 407. Diode switches 403 and 404 function as a combining circuit that adds the direct current voltage that is outputted from direct current power supply 411 to the output signal of the above-described pulse amplification circuit and that outputs the resultant signal. A signal $V_{d2}$ that is inputted to LPF 407 has a waveform as shown in FIG. 11(a).

LPF 407 is provided for example with inductor 405 and capacitive element 406, smoothens pulse signals that are outputted from diode switches 403 and 404, removes a spurious component from the smoothed pulse signals, and supplies the resultant signals as a power supply voltage to RF-PA 412.

The power amplifier according to the first exemplary embodiment amplifies amplitude component signal 413 with a gain in proportion to the direct current voltage $V_1$ that is outputted from direct current power supply 408 and supplies a signal $V_{out}$ in which a direct current voltage $V_2$ that is outputted from direct current power supply 411 is added to the amplified signal to power supply terminal 452 of RF-PA 412 as shown in FIG. 11(b). Thus, an output signal of RF-PA 412 is amplitude-modulated with the signal $V_{out}$ that is outputted from LPF 407.

Since the signal $V_{out}$ that is supplied as a power supply voltage to RF-PA 412 is a signal that is restricted such that it does not become lower than the output voltage $V_2$ of direct current power supply 411, when the power supply voltage drops, distortion that occurs in the output signal of RF-PA 412 is suppressed.

Figure 7:
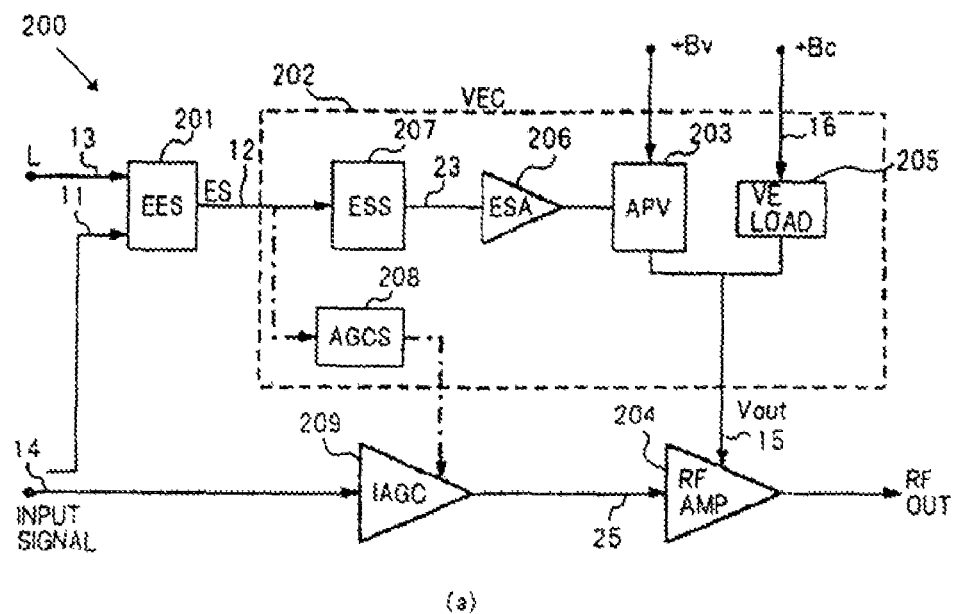
FIG. 7 shows the structure and operation of a power amplifier described in Patent Literature 1, (a) of a drawing which is a block diagram that shows a circuit structure; (b) of a drawing which is a waveform diagram that shows an exemplary input signal, and (c) of a drawing which is a waveform diagram that shows an exemplary output signal of a power supply modulator.
Figure 7:
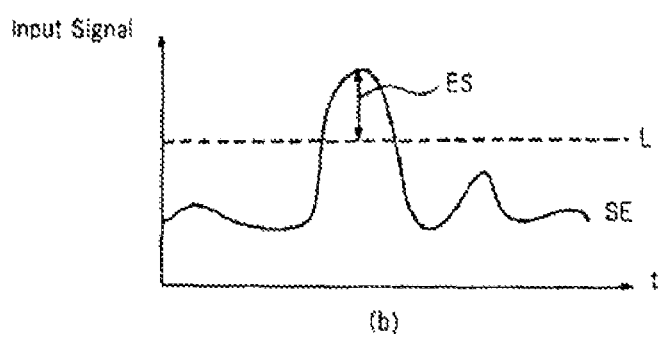
Figure 7:
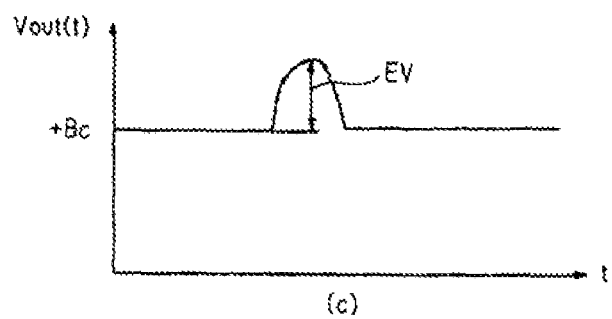

In addition, since the voltage in which the output voltage $V_2$ of direct current power supply 411 is added to the amplified signal of amplitude component signal 413 is supplied to power supply terminal 452 of RF-PA 412, unlike the power amplifier shown in FIG. 7(a) (described in Patent Literature 1), differential discontinuance does not occur in the waveform of the power supply voltage supplied to the RF-PA. Thus, distortion that occurs in the output signal of RF-PA 412 can be reduced in comparison with that of the power amplifier described in Patent Literature 1.

Power loss from power supply modulator 410 shown in FIG. 10 is mainly caused by switching losses that occur in switch element 401 and diode switches 403 and 404.

A switching loss $L_{SW}$ of switch element 401 can be denoted by the following mathematical expression (1).

[Mathematical expression 1]

$$L_{sw} = \frac{1}{6R} f_{SW} \cdot \Delta t \cdot V_1^2 \quad (1)$$

where R is the impedance of the load of RF-PA 412, $f_{SW}$ is the average switching frequency of pulse modulation signal 414, Δt is the sum of switching times in on and off states.

On the other hand, a switching loss $L_{diode403}$ of diode switch 403 can be denoted by the following mathematical expression (2).

[Mathematical expression 2]

$$L_{diode403} = \frac{1}{6R} f_{SW} \cdot \Delta t \cdot V_1 (V_1 + V_2) \quad (2)$$

On the other hand, a switching loss $L_{diode404}$ of diode switch 404 can be denoted by the following mathematical expression (3).

[Mathematical expression 3]

$$L_{diode404} = \frac{1}{6R} f_{SW} \cdot \Delta t \cdot V_1 V_2 \quad (3)$$

Thus, a sum $L_{total}$ of the power losses of power supply modulator 410 can be denoted by the following mathematical expression (4).

[Mathematical expression 4]

$$L_{total} = \frac{1}{3R} f_{SW} \cdot \Delta t \cdot V_1 (V_1 + V_2) \quad (4)$$

On the other hand, a power $P_{OUT}$ that is outputted from power supply modulator 410 can be denoted by the following formula (5).

[Mathematical expression 5]

$$P_{out} = d \frac{(V_1 + V_2)^2}{R} + (1-d) \frac{V^2}{R} \quad (5)$$

where d is the average duty of pulse modulation signal 414.

Thus, a ratio $P_{OUT}/L_{total}$ of the output power $P_{out}$ of power supply modulator 410 denoted by mathematical expression (5) and the power loss $L_{total}$ denoted by mathematical expression (4) can be denoted by the following mathematical expression (6).

[Mathematical expression 6]

$$\frac{P_{out}}{L_{total}} = \frac{3}{f_{SW} \cdot \Delta t} \left[ (2d+1)r + \frac{1-d}{r+1} - 1 \right] \quad (6)$$

where $r = V_2 / V_1 (> 0)$.

As is clear from mathematical expression (6), $P_{out}/L_{total}$ is a function that increases simply in proportion to the value of r. In addition, as denoted by the following mathematical expression (7), power efficiency η is a function that increases simply in proportion to the value of $P_{out}/L_{total}$.

[Mathematical expression 7]

$$\eta = \frac{P_{out}}{P_{out} + L_{total}} = \frac{1}{1 + (P_{out}/L_{total})^{-1}} \quad (7)$$

In other words, the power amplifier shown in FIG. 10 is structured in such a manner that by supplying the direct current voltage $V_2$ from direct current power supply 411 to diode switches 403 and 404, the value of r is increased. Thus, the power amplifier according to this exemplary embodiment can improve the power efficiency η of power supply modulator 410.

The applicant of the present application has experimentally confirmed that when direct current power supply 411 is absent ($V_2$=0V), the power efficiency of power supply modulator 410 is 50 to 70% and that when direct current power supply 411 is used ($V_2$=5V to 10V), the power efficiency of power supply modulator 410 is improved to 85 to 95%.

Figure 8:
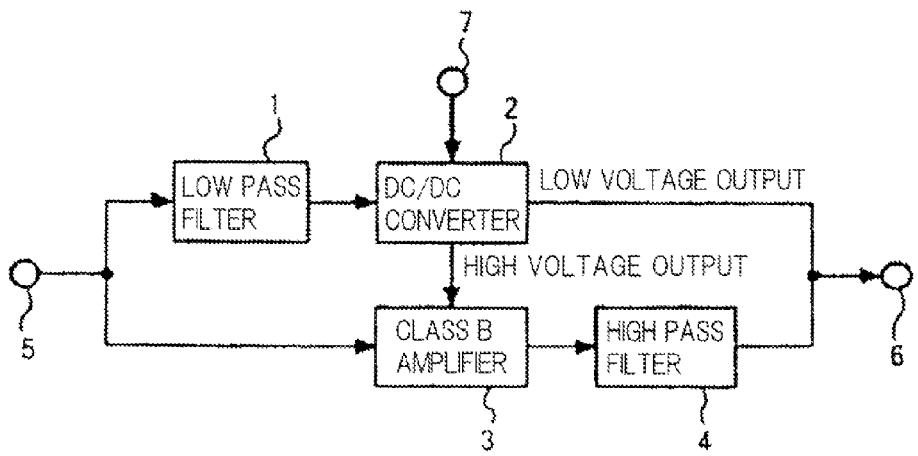
FIG. 8 is a block diagram showing a structure of a power amplifier described in Patent Literature 2.

Unlike the power amplifier shown in FIG. 8 (described in Patent Literature 2), the power amplifier according to this exemplary embodiment does not need a process that separates an amplitude component signal into a low frequency component and a high frequency component, amplifies them, and then combines them. Thus, since the circuit that separates the amplitude component signal into the low frequency component and the high frequency component and the circuit that combines the low frequency component and the high frequency component become unnecessary, greater miniaturization and cost reduction can be achieved in the power amplifier according to this exemplary embodiment than in the power amplifier described in Patent Literature 2.

In addition, unlike the power amplifier shown in FIG. 8 (described in Patent Literature 2), since the power amplifier according to this exemplary embodiment does not use a class B amplifier, greater improvement in the efficiency of the power amplifier according to this exemplary embodiment can be achieved than in the power amplifier described in Patent Literature 2.

Figure 9:
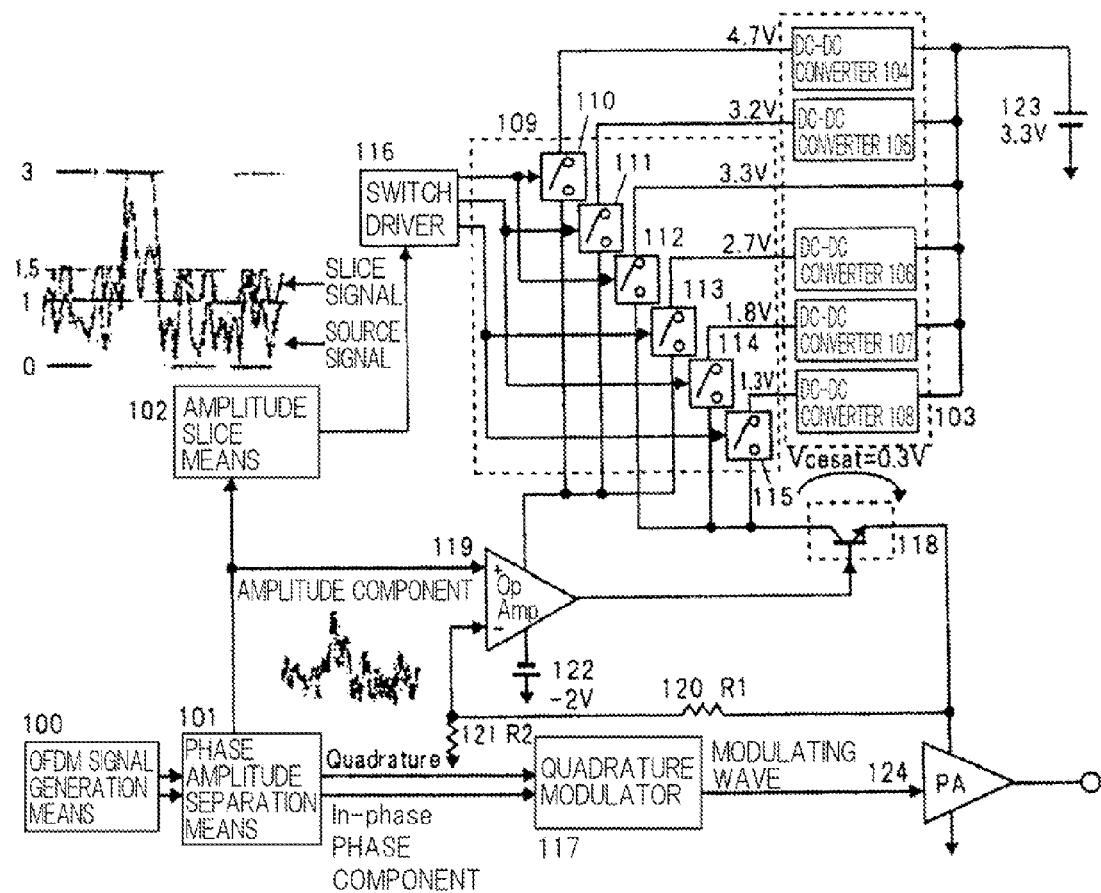
FIG. 9 is a block diagram showing a structure of a power amplifier described in Patent Literature 3.

In addition, unlike the power amplifier shown in FIG. 9 (described in Patent Literature 3), the power amplifier according to this exemplary embodiment does not need to control switching of direct current voltages generated by a plurality of power supply devices. Thus, since the power amplifier according to this exemplary embodiment can be structured with a simpler circuit than the power amplifier described in Patent Literature 3, greater miniaturization and cost reduction can be achieved in the power amplifier according to this exemplary embodiment than in the power amplifier described in Patent Literature 3.

The power efficiency of the entire power amplifier according to the first exemplary embodiment mainly depends on the power efficiency of power supply modulator 410 and that of RF-PA 412 and can be denoted by (power efficiency of power supply modulator 410)×(power efficiency of RF-PA 412).

As described above, when the output voltage $V_2$ of direct current power supply 411=0V, the power efficiency of power supply modulator 410 is 50 to 70%; when the output voltage is set to $V_2$=5 to 10 V, the power efficiency is improved to 85 to 95%. In contrast, the power efficiency of RF-PA 412 generally decreases as the value of the output voltage $V_2$ of direct current power supply 411 is increased.

Thus, in the power amplifier according to the first exemplary embodiment, when the value of the output voltage $V_2$ of direct current power supply 411 is set such that the power efficiency that is improved by power supply modulator 410 becomes greater than the power efficiency that has been lost by RF-PA 412, the power efficiency of the entire power amplifier can be improved.

Thus, the power amplifier according to this exemplary embodiment can realize the function of a power amplifier based on the ET system or EER system that can reduce an increase of circuit scale, have high power efficiency, reduce distortion that occurs in an output signal, and accurately restore the waveform of an input signal.

(Second Exemplary Embodiment)

Figure 12:
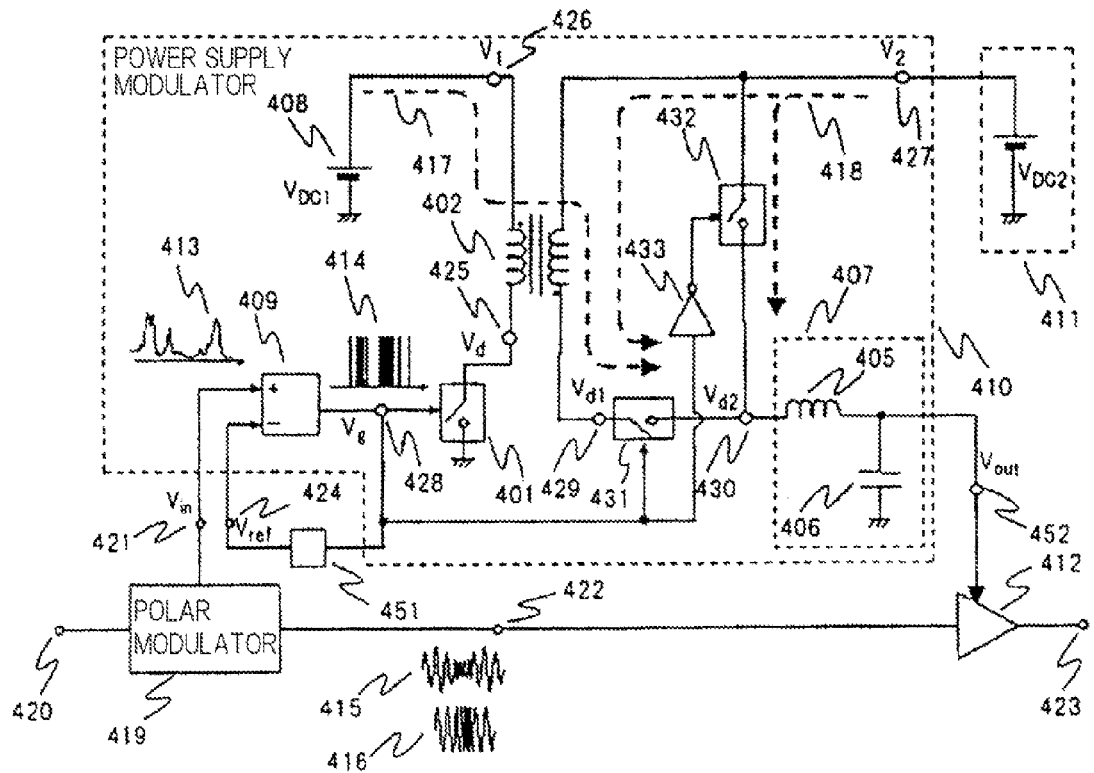
FIG. 12 is a block diagram showing a structure of a power amplifier according to a second exemplary embodiment.

FIG. 12 is a block diagram showing a structure of a power amplifier according to a second exemplary embodiment.

The power amplifier according to the second exemplary embodiment is structured to include switches 431 and 432 instead of diode switches 403 and 404 with which power supply modulator 410 according to the first exemplary embodiment shown in FIG. 10 is provided, and is also structured to include inverter 433, that is further added, and that controls the operations of switches 431 and 432. For switches 431 and 432, transistors, for example, MOSFETs or the like can be used. The other structure and operation are the same as those of the power amplifier according to the first exemplary embodiment.

In such a structure, like power supply modulator 410 presented in the first exemplary embodiment, a voltage in which a direct current voltage $V_2$ that is outputted from direct current power supply 411 is added to a signal $V_{d1}$ that is outputted from a secondary winding of transformer 402 is supplied to power supply terminal 452 of RF-PA 412 through LPF 407.

Power losses occur in diode switches 403 and 404 with which power supply modulator 410 of the first exemplary embodiment is provided because of their forward voltages.

In contrast, since the power amplifier according to the second exemplary embodiment uses switches 431 and 432 whose forward voltages are lower than those of diode switches 403 and 404, there can be greater reduction in the power loss of power supply modulator 410 than in the power loss of power supply modulator 410 of the first exemplary embodiment.

(Third Exemplary Embodiment)

Figure 13:
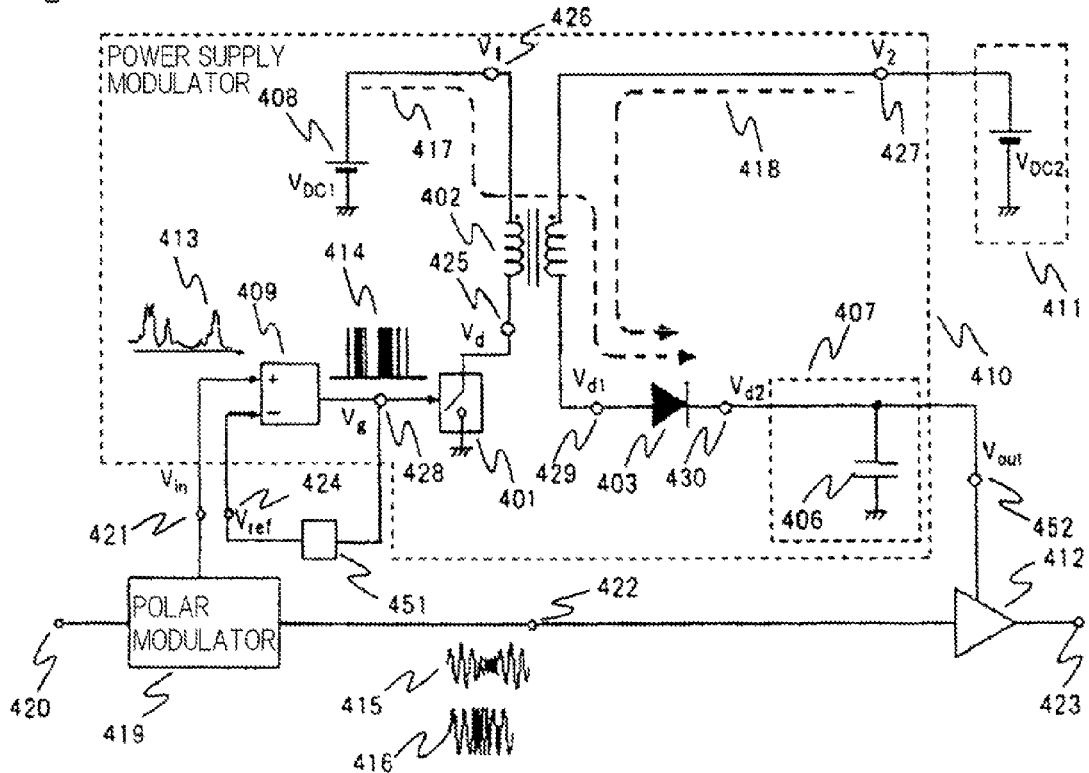
FIG. 13 is a block diagram showing a structure of a power amplifier according to a third exemplary embodiment.

FIG. 13 is a block diagram showing a structure of a power amplifier according to a third exemplary embodiment.

The power amplifier according to the third exemplary embodiment is structured in such a manner that diode switch 404 and inductor 405 are removed from power supply modulator 410 shown in FIG. 10 and such that the polarities of a primary winding and a secondary winding of transformer 402 become identical. The other structure and operation are the same as those of the power amplifier according to the first exemplary embodiment.

In such a structure, like power supply modulator 410 presented in the first exemplary embodiment, a voltage in which a direct current voltage $V_2$ that is outputted from direct current power supply 411 is added to a signal $V_{d1}$ that is outputted from the secondary winding of transformer 402 is supplied to power supply terminal 452 of RF-PA 412 through LPF 407.

Since using the power amplifier according to the third exemplary embodiment can lead to a greater reduction in the number of parts than using the power amplifier according to the first and second exemplary embodiment, further miniaturization and cost reduction can be achieved by using the power amplifier according to the third exemplary embodiment.

(Forth Exemplary Embodiment)

Figure 14:
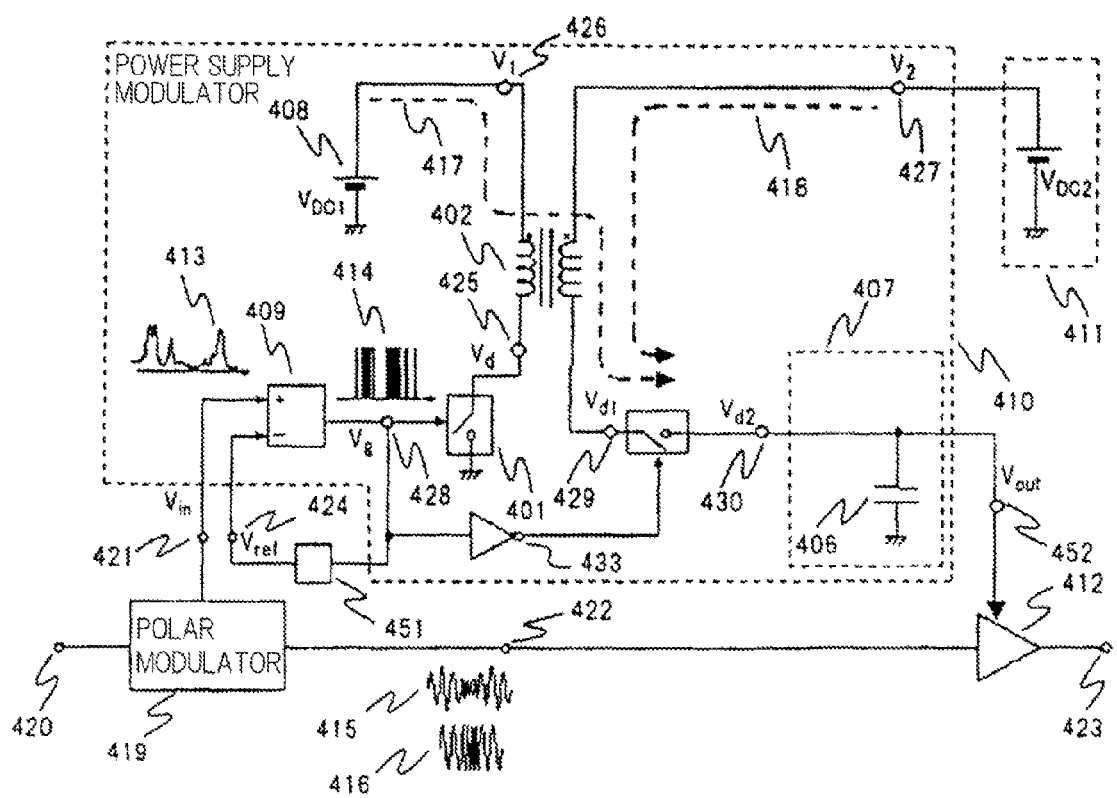
FIG. 14 is a block diagram showing a structure of a power amplifier according to a fourth exemplary embodiment.

FIG. 14 is a block diagram showing the structure of a power amplifier according to a fourth exemplary embodiment.

The power amplifier according to the fourth exemplary embodiment is structured to include switch 431 instead of diode switch 403 with which power supply modulator 410 of the third exemplary embodiment shown in FIG. 13 is provided and to include inverter 433 that is further added and that controls the operation of switch 431. For switch 431, a transistor, for example, a MOSFET or the like can be used. Other structure and operation are the same as those of the power amplifier according to the first exemplary embodiment.

In such a structure, like power supply modulator 410 presented in the first exemplary embodiment, a voltage in which a direct current voltage $V_2$ that is outputted from direct current power supply 411 is added to a signal $V_{d1}$ that is outputted from a secondary winding of transformer 402 is supplied to power supply terminal 452 of RF-PA 412 through LPF 407.

Like the second exemplary embodiment, since the power amplifier according to the fourth exemplary embodiment uses switch 431 instead of diode switch 403 whose forward voltage is higher than that of switch 431, a power loss of power supply modulator 410 can he more reduced than that of the third exemplary embodiment.

(Fifth Exemplary Embodiment)

Figure 15:
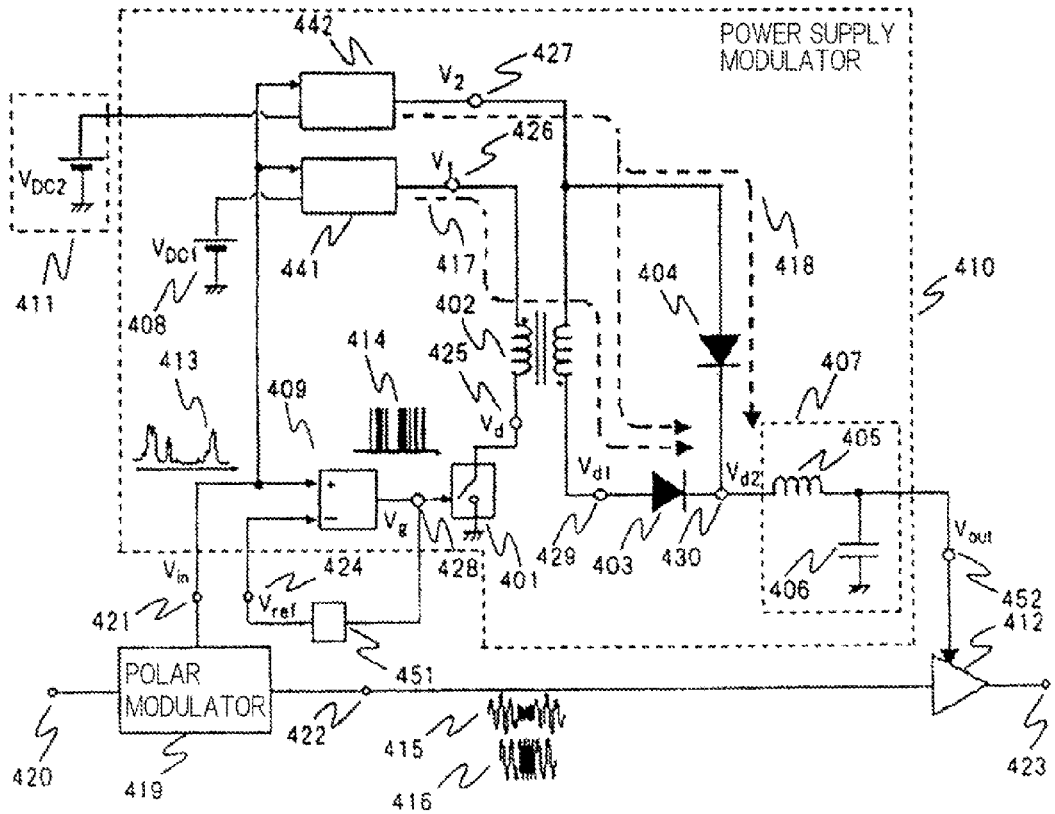
FIG. 15 is a block diagram showing a structure of a power amplifier according to a fifth exemplary embodiment.

FIG. 15 is a block diagram showing an exemplary structure of a power amplifier according to a fifth exemplary embodiment.

The power amplifier according to the fifth exemplary embodiment is structured to further include control power supply 441 that is disposed between direct current power supply 408 and a primary winding of transformer 402 with which power supply modulator 410 is provided and that amplifies amplitude component signal 413 or its low frequency component and control power supply 442 that is disposed between direct current power supply 411 and a second winding of transformer 402 and that amplifies amplitude component signal 413 or its low frequency component. It is preferred that for controlling power supplies 441 and 442, for example, switching regulator type DC-DC converters that have high power efficiency be used. The DC-DC converters are described for example in the above-described Patent Literature 2. If the low frequency component of amplitude component signal 413 is amplified by control power supplies 441 and 442, it is preferred that the low frequency component be extracted from amplitude component signal 413 or that an amplified signal of amplitude component signal 413 using the low pass filters or the like with which control power supplies 441 and 442 are provided and the low frequency component be amplified. Generally, the power efficiencies of the DC-DC converters used as control power supplies 441-442 are improved in inverse proportion to the output frequencies (band widths). In addition, the cost of the circuit structured to include switching elements is in inverse proportion to their output frequencies. Thus, in the structure in which the low frequency component of amplitude component signal 413 is amplified by control power supplies 441 and 442, the power efficiency of power supply modulator 410 can be further improved and the cost of power supply modulator 410 can be reduced. Since the other structure and operation are the same as those of the first exemplary embodiment shown in FIG. 10, their explanation will he omitted.

In the power amplifier according to the fifth exemplary embodiment, amplitude component signal 413 that is amplified by control power supplies 441 and 442 or its low frequency component is supplied to the primary winding or the secondary winding of transformer 402. Thus, when the output power of RF-PA 412 is low, since output voltages $V_1$ and $V_2$ of control power supplies 441 and 442 are lowered, resulting in reducing the supply of wasteful power to power supply terminal 452 of RF-PA 412, there can thereby be a greater improvement in the power efficiency of RF-PA 412 than in the power efficiency of the power amplifiers according to the first to fourth exemplary embodiments.

(Sixth Exemplary Embodiment)

Figure 16:
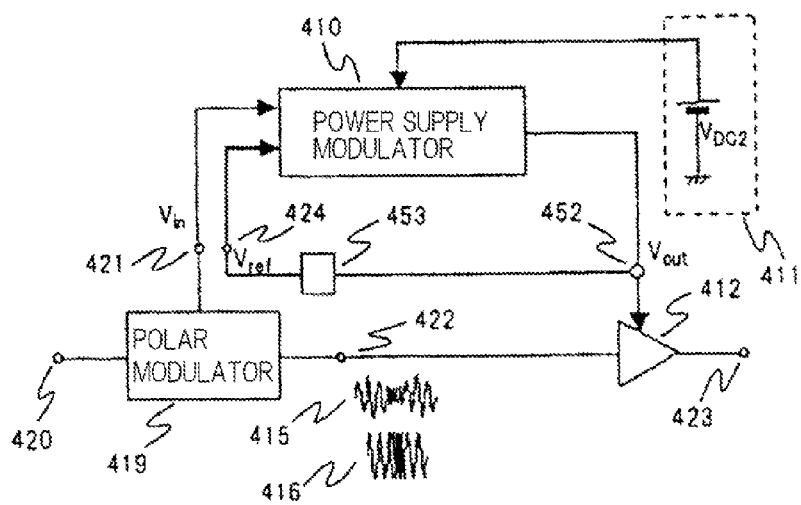
FIG. 16 is a block diagram showing a structure of a power amplifier according to a sixth exemplary embodiment.

FIG. 16 is a block diagram showing a structure of a power amplifier according to a sixth exemplary embodiment.

The power amplifier according to the sixth exemplary embodiment is structured in such a manner that an output signal of power supply modulator 410 is negatively fed back to an input of pulse modulator 409 through feedback circuit 453.

Feedback circuit 453 compensates for the amplitude and phase of the signal that is fed back to pulse modulator 409. Power supply modulator 410 may be structured according to any one of the above-described first exemplary embodiment to fifth exemplary embodiment.

In the power amplifier according to the sixth exemplary embodiment, since the output signal of power supply modulator 410 is negatively fed back to pulse modulator 409, an error that occurs due to circuit failure in power supply modulator 410 and characteristic fluctuation of power supply modulator 410 that occurs due to temperature fluctuation are compensated. Thus, power supply modulator 410 can more accurately amplify amplitude component signal 413.

In addition, since the output signal of power supply modulator 410 is fed back to input terminal 424 (Vref) of pulse modulator 409, not only the fluctuation of the output signal of power supply modulator 410 against the fluctuation of the load of RF-PA 412 is reduced, but also memory effect that occurs in RF-PA 412 and linear deterioration that occurs between the input and output signals of RF-PA 412 due to the memory effect can be reduced.

(Seventh Exemplary Embodiment)

Figure 17:
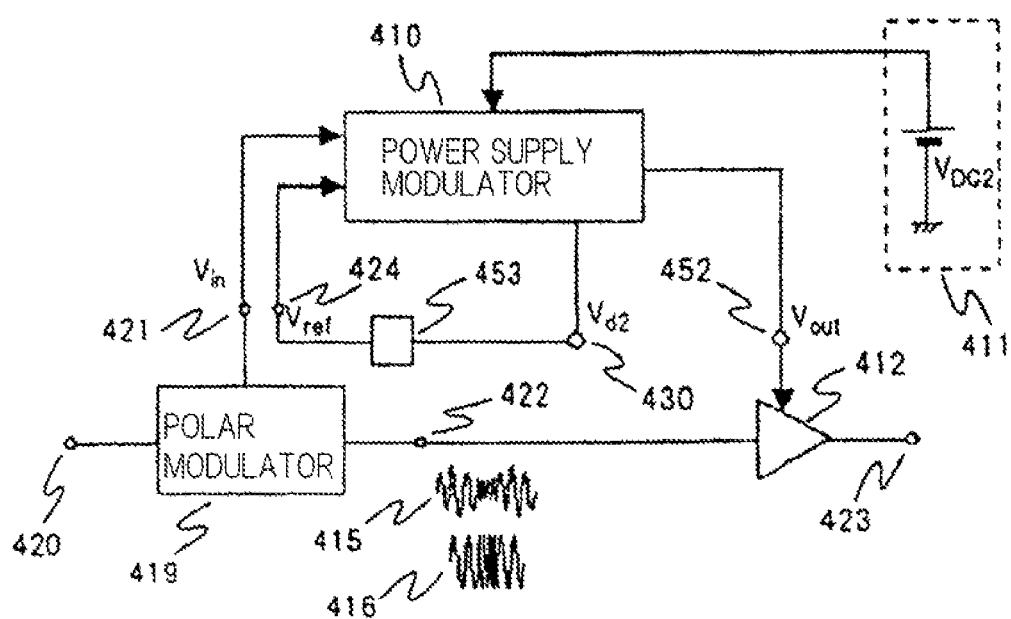
FIG. 17 is a block diagram showing a structure of a power amplifier according to a seventh exemplary embodiment.

FIG. 17 is a block diagram showing a structure of a power amplifier according to a seventh exemplary embodiment.

The power amplifier according to the seventh exemplary embodiment is structured in such a manner that an input signal (Vd2) of LPF 407 with which power supply modulator 410 is provided, namely an output signal of the above-described combining circuit, is negatively fed back to an input of pulse modulator 409 through integrator 451. Power supply modulator 410 may be structured according to any one of the above-described first exemplary embodiment to fifth exemplary embodiment.

Like the power amplifier according to the sixth exemplary embodiment, in the power amplifier according to the seventh exemplary embodiment, since the input signal (Vd2) of LPF 407 is negatively fed back to the input of pulse modulator 409, an error that occurs due to circuit failure in power supply modulator 410 and characteristic fluctuation of power supply modulator 410 that occurs due to temperature fluctuation or the like are compensated. Thus, power supply modulator 410 can more accurately amplify amplitude component signal 413.

However, according to the seventh exemplary embodiment, since LPF 407 with which power supply modulator 410 is provided is not included in the feedback loop, there is greater deterioration in the linear characteristics between the input and output signals of power supply modulator 410 than in that of the sixth exemplary embodiment. However, according to the seventh exemplary embodiment, since LPF 407 that has a large phase shift amount is not included in the feedback loop, oscillation or the like does not occur more easily in power supply modulator 410 than in power supply modulator 410 of the sixth exemplary embodiment, resulting in allowing power supply modulator 410 to operate more stably than power supply modulator of the sixth exemplary embodiment.

Now, with reference to the exemplary embodiments, the present invention has been explained. However, it should be understood by those skilled in the art that the structure and details of the present invention may be changed in various manners without departing from the scope of the present invention.

The invention claimed is:

1. A power amplifier that amplifies an RF modulation signal containing an amplitude modulation component and a phase modulation component, comprising:

a polar modulator that outputs an amplitude component signal that is the amplitude modulation component of said RF modulation signal;

a first direct current power supply that outputs a direct current voltage;

a pulse modulator that pulse-modulates said amplitude component signal;

a pulse amplification circuit that amplifies a pulse modulation signal that is outputted from said pulse modulator;

a combining circuit that adds a direct current voltage that is outputted from said first direct current power supply to an output signal of said pulse amplification circuit;

a low pass filter that smoothens an output signal of said combining circuit; and an RF amplifier that not only amplifies said RF modulation signal, but also amplitude-modulates the amplified signal with an output signal of said low pass filter and outputs the resultant signal.

2. The power amplifier according to claim 1,
wherein said pulse amplification circuit includes:
a second direct current power supply that outputs a direct current voltage;
a switch element that is turned on or off corresponding to the pulse modulation signal that is outputted from said polar modulator; and
a transformer, in which an output voltage of said second direct current power supply is supplied to one end of a primary winding of said transformer, said switch element being connected to another end of said primary winding.

3. The power amplifier according to claim 2,
wherein said combining circuit includes:
a first diode whose anode is connected to one end of a secondary winding of said transformer; and
a second diode whose anode is connected to another end of the second winding of said transformer, a cathode of said first diode and a cathode of said second diode being connected,
wherein the direct current voltage that is outputted from said first direct current power supply is supplied to the other end of the secondary winding of said transformer.

4. The power amplifier according to claim 2,
wherein said combining circuit includes a diode whose anode is connected to one end of a secondary winding of said transformer, and
wherein the direct current voltage that is outputted from said direct current power supply is supplied to another end of the secondary winding of said transformer.

5. The power amplifier according to claim 2,
wherein said combining circuit includes:
a first switch connected to one end of a secondary winding of said transformer; and
a second switch connected between another end of the secondary winding of said transformer and said first switch,
wherein the direct current voltage that is outputted from said first direct current power supply is supplied to the other end of the secondary winding of said transformer.

6. The power amplifier according to claim 2,
wherein said combining circuit includes a switch connected to one end of a secondary winding of said transformer, and
wherein the direct current voltage that is outputted from said direct current power supply is supplied to another end of the secondary winding of said transformer.

7. The power amplifier according to claim 1,
wherein said pulse modulator is structured in such a manner that an output signal of said pulse modulator is negatively fed back to an input of said pulse modulator.

8. The power amplifier according to claim 1,
wherein said pulse modulator is structured in such a manner that the output signal of said low pass filter is negatively fed back to an input of said low pass filter.

9. The power amplifier according to claim 1,
wherein said pulse modulator is structured in such a manner that the output signal of said combining circuit is negatively fed back to an input of said combining circuit.

10. A power amplifier that amplifies an RF modulation signal containing an amplitude modulation component and a phase modulation component, comprising:
a polar modulator that outputs an amplitude component signal that is the amplitude modulation component of said RF modulation signal and a phase component signal that is the phase modulation component of said RF modulation signal;
a first direct current power supply that outputs a direct current voltage;
a pulse modulation circuit that pulse-modulates said amplitude component signal;
a pulse amplification circuit that amplifies a pulse modulation signal that is outputted from said pulse modulation circuit;
a combining circuit that adds a direct current voltage that is outputted from said first direct current power supply to an output signal of said pulse amplification circuit;
a low pass filter that smoothens an output signal of said combining circuit; and
an RF amplifier that not only amplifies said phase modulation signal, but also amplitude-modulates the amplified signal with an output signal of said low pass filter and outputs the resultant signal.

11. A power amplifier that amplifies an RF modulation signal containing an amplitude modulation component and a phase modulation component, comprising:
a polar modulator that outputs an amplitude component signal that is the amplitude modulation component of said RF modulation signal;
a control power supply that amplifies said amplitude component signal or a low frequency component of the amplitude component signal;
a pulse modulator that pulse-modulates said amplitude component signal;
a pulse amplification circuit that amplifies a pulse modulation signal that is outputted from said pulse modulator;
a combining circuit that adds an output voltage of said control power supply to an output signal of said pulse amplification circuit;
a low pass filter that smoothens an output signal of said combining circuit; and
an RF amplifier that not only amplifies said RF modulation signal, but also amplitude-modulates the amplified signal with an output signal of said low pass filter and outputs the resultant signal.

12. The power amplifier according to claim 11,
wherein said pulse amplification circuit includes:
a switch element that is turned on or off corresponding to the pulse modulation signal that is outputted from said polar modulator; and
a transformer, in which an output voltage of said control power supply is supplied to one end of a primary winding of said transformer, said switch element being connected to another end of said primary winding.

13. The power amplifier according to claim 12,
wherein said combining circuit includes:
a first diode whose anode is connected to one end of a secondary winding of said transformer; and
a second diode whose anode is connected to another end of the second winding of said transformer, a cathode of said first diode and a cathode of said second diode being connected,
wherein the output voltage of said control power supply is supplied to the other end of the secondary winding of said transformer.

14. The power amplifier according to claim 12,
wherein said combining circuit includes a diode whose anode is connected to one end of a secondary winding of said transformer, and
wherein the output voltage of said control power supply is supplied to another end of the secondary winding of said transformer.

15. The power amplifier according to claim 12,
wherein said combining circuit includes:
a first switch connected to one end of a secondary winding of said transformer; and
a second switch connected between another end of the secondary winding of said transformer and said first switch,
wherein the output voltage of said control power supply is supplied to the other end of the secondary winding of said transformer.

16. The power amplifier according to claim 12,
wherein said combining circuit includes a switch connected to one end of a secondary winding of said transformer, and
wherein the output voltage of said control power supply is supplied to another end of the secondary winding of said transformer.

17. A power amplifier that amplifies an RF modulation signal containing an amplitude modulation component and a phase modulation component, comprising:
a polar modulator that outputs an amplitude component signal that is the amplitude modulation component of said RF modulation signal and a phase component signal that is the phase modulation component of said RF modulation signal;
a control power supply that amplifies said amplitude component signal or a low frequency component of the amplitude component signal;
a pulse modulation circuit that pulse-modulates said amplitude component signal;
a pulse amplification circuit that amplifies a pulse modulation signal that is outputted from said pulse modulation circuit;
a combining circuit that adds an output voltage of said control power supply to an output signal of said pulse amplification circuit;
a low pass filter that smoothens an output signal of said combining circuit; and
an RF amplifier that not only amplifies said phase component signal, but also amplitude-modulates the amplified signal with an output signal of said low pass filter and outputs the resultant signal.

18. A power amplifying method that amplifies an RF modulation signal containing an amplitude modulation component and a phase modulation component, comprising:
extracting an amplitude component signal that is the amplitude modulation component of said RF modulation signal;

pulse-modulating said amplitude component signal;
amplifying a pulse modulation signal that is a signal in which said amplitude component signal is pulse-modulated;
adding a direct current voltage to said amplified pulse modulation signal so as to smoothen said amplified pulse modulation signal; and
amplifying said RF modulation signal, amplitude-modulating the amplified signal with said smoothened signal, and outputting the resultant signal.

19. A power amplifying method that amplifies an RF modulation signal containing an amplitude modulation component and a phase modulation component, comprising:
extracting an amplitude component signal that is the amplitude modulation component of said RF modulation signal and a phase component signal that is the phase modulation component of said RF modulation signal;
pulse-modulating said amplitude component signal;
amplifying a pulse modulation signal that is a signal in which said amplitude component signal is pulse-modulated;
adding a direct current voltage to the amplified pulse modulation signal so as to smoothen the amplified pulse modulation signal; and
amplifying said phase component signal, amplitude-modulating the amplified signal with said smoothened signal, and outputting the resultant signal.

20. A power amplifying method that amplifies an RF modulation signal containing an amplitude modulation component and a phase modulation component, comprising:
extracting an amplitude component signal that is the amplitude modulation component of said RF modulation signal;
pulse-modulating said amplitude component signal;
amplifying a pulse modulation signal that is a signal in which said amplitude component signal is pulse-modulated;
adding said amplitude component signal or a signal in which a low frequency component of the amplitude component signal is amplified to said amplified pulse modulation signal so as to smoothen said amplified pulse modulation signal; and
amplifying said RF modulation signal, amplitude-modulating the amplified signal with said smoothened signal, and outputting the resultant signal.

21. A power amplifying method that amplifies an RF modulation signal containing an amplitude modulation component and a phase modulation component, comprising:
extracting an amplitude component signal that is the amplitude modulation component of said RF modulation signal and a phase component signal that is the phase modulation component of said RF modulation signal;
pulse-modulating said amplitude component signal;
amplifying a pulse modulation signal that is a signal in which said amplitude component signal is pulse-modulated;
adding said amplitude component signal or a signal in which a low frequency component of the amplitude component signal is amplified to said amplified pulse modulation signal so as to smoothen said amplified pulse modulation signal; and
amplifying said phase component signal, amplitude-modulating the amplified signal with said smoothened signal, and outputting the resultant signal.

* * * * *